United States Patent
Castrucci

(10) Patent No.: US 6,521,466 B1
(45) Date of Patent: Feb. 18, 2003

(54) APPARATUS AND METHOD FOR SEMICONDUCTOR WAFER TEST YIELD ENHANCEMENT

(76) Inventor: Paul Castrucci, 41 Pheasant Way, South Burlington, VT (US) 05403

( * ) Notice: Subject to any disclaimer, the term of this patent is extended or adjusted under 35 U.S.C. 154(b) by 0 days.

(21) Appl. No.: 10/124,125

(22) Filed: Apr. 17, 2002

(51) Int. Cl.[7] ............................ H01L 21/00; G06F 19/00

(52) U.S. Cl. ............................................ 438/5; 700/121

(58) Field of Search ....................... 438/5, 7, 10, 12, 438/13, 14, 795; 700/108, 109, 110, 121; 134/113

(56) References Cited

U.S. PATENT DOCUMENTS

| | | | |
|---|---|---|---|
| 5,868,862 A | 2/1999 | Douglas et al. | |
| 6,203,406 B1 | 3/2001 | Rose et al. | |
| 6,277,753 B1 | 8/2001 | Mullee et al. | |
| 2001/0050096 A1 | * 12/2001 | Costantini et al. | 134/58 |

OTHER PUBLICATIONS

Wayne Ellis, Paul Castrucci, Internal Report, Applied Materials, "AMAT Scenario 2003–IC Yield Analysis", Oct. 1998.
J.B. Rubin, L.D. Sivils, A.A. Busnaina, "Precision Cleaning of Semiconductor Surfaces Using Carbon Dioxide–Based Fluids", Proceedings Semicon West 99, Symposium on Contamination Free Manufacturing for Semiconductor Processing (San Francisco, CA) Jul. 12–14, 1999.

SCORR–Report 2001 R&D 100 Joint Entry.

* cited by examiner

*Primary Examiner*—Kamand Cuneo
*Assistant Examiner*—Evan Pert
(74) *Attorney, Agent, or Firm*—AKC Patents; Aliki K. Collins

(57) ABSTRACT

An improved semiconductor wafer processing system includes defect detection equipment and defect eradication equipment. The defect eradication equipment is a supercritical fluid cleaning apparatus. The defect detection equipment creates a record for each wafer indicating defect identification and characterization results at each wafer processing station. The supercritical fluid cleaning apparatus receives the defect data from the defect detection equipment and applies a defect appropriate supercritical fluid cleaning recipe based on generic cleaning recipes and/or defect specific cleaning recipes. The system further includes equipment for transferring a plurality of semiconductor wafer among a plurality of processing stations under computer control. The improved semiconductor wafer processing system produces IC test yields of the order of 68% and a defect density of 0.1 defects/$cm^2$ for a 430 $mm^2$ chip.

36 Claims, 8 Drawing Sheets

APPARATUS AND METHOD FOR SEMICONDUCTOR WAFER TEST YIELD ENHANCEMENT

FIELD OF THE INVENTION

The present invention relates to an apparatus and a method for semiconductor wafer yield enhancement, and more particularly to a semiconductor wafer test yield enhancement that integrates a defect detection and characterization system, and a defect eradication system.

BACKGROUND OF THE INVENTION

Surface cleaning of a semiconductor wafer has a significant bearing on device test yields. As the semiconductor industry pushes for smaller integrated circuit (IC) dimensions, e.g., 0.35 micron, 0.25 micron and 0.1 micron, the defect density level and size of the smallest particle capable of causing a failure in an IC decrease, as well. For example, for IC devices of 0.35 microns or less particles of the order of one third of the device size, i.e., 0.12 micron or less can cause the circuit to malfunction. Moore's Law projects that by 2005 IC devices will have over 700 million transistors per chip (FIG. 1). The Semiconductor Industry Association (SIA) Roadmap projects that the 0.115 micron/300 millimeter wafer technology generation in 2005 will require a very low defect level of only 1260 defects per millimeter square for robust test yields.

Table 1 illustrates the effect of defect density level on test yield for several 0.18 micron products. For a 1 Gigabit dynamic RAM (DRAM) memory a decrease in defect density from 0.10 Defects/cm$^2$ to 0.01 Defects/cm$^2$ increases the device process yield from 12% to 81%. Similar yield increases are observed in a 1000 MIP Microprocessor and a System on a Chip (SOC) device. The results of Table 1 are included in an internal report presented to Applied Materials by Dr. Wayne Ellis and Paul Castrucci, entitled "AMAT Scenario 2003-IC Yield Analysis" October 1998, incorporated herein by reference.

The IC industry needs technology tools that will eradicate defects in order to achieve the very low defect levels required to produce products with very fine feature sizes while maintaing commercially viable wafer processes with high test yields.

TABLE 1

| Product | Defect Density (Defects/cm$^2$) | Test Yield (%) |
| --- | --- | --- |
| 1 Gigabit DRAM | 0.01 | 81 |
| 1 Gigabit DRAM | 0.03 | 53 |
| 1 Gigabit DRAM | 0.1 | 12 |
| Microprocessor (1000 MIP) | 0.01 | 70 |
| Microprocessor (1000 MIP) | 0.03 | 28 |
| Microprocessor (1000 MIP) | 0.1 | 12 |
| System on a Chip (SOC) | 0.01 | 64 |
| System on a Chip (SOC) | 0.03 | 25 |
| System on a Chip (SOC) | 0.1 | 12 |

Surface defects of an IC include surface structural disorders and discrete pieces of matter that range in size from submicron dimension to granules visible to observation with the eye. Surface structural disorders include microscratches, metal etching stringers, missing contacts, and bridging due to tungsten residue during chemical mechanical polishing (CMP). Discrete pieces of matter may be fine dust, dirt particles, foreign molecules including carbon, hydrogen, and/or oxygen. Particulate contaminants ("particulates") frequently adhere to a surface by weak covalent bonds, electrostatic forces, van der Waals forces, hydrogen bonding, coulombic forces, or dipole-dipole interactions, making removal of the particulates difficult. Particulates frequently encountered in practice include polysilicon slivers, photoresist particles, metal oxide particles, and slurry residue. It is known that not all particulates are equally undesirable. For example, particulates that adhere at some non-sensitive portions of the IC circuitry may have no effect on operation or performance, and need not necessarily be removed ("don't cares"). On the other hand, particulates that adhere to active areas or critical locations ("killer defects") can cause failure of the IC circuitry and must be removed for proper operation.

Semiconductor surface cleaning technology involves breaking the above mentioned adhesion bonds and removal of the contaminants. The known methods of semiconductor surface cleaning include chemical wet-processes, e.g. RCA and Piranha etch, chemical dry-processes, mechanical processes, thermal, ultrasonic, optical techniques and combinations thereof. The chemical wet-processes require large amounts of chemical solutions and water. These chemical solutions are expensive, frequently introduce new contaminants, and their disposal causes an environmental problem. Thermal processes require in some cases melting of the top surface and removal via ultra high vacuum pressure. The melting of the top layer may disturb the integrity of the previously deposited layers and the high vacuum equipment are both expensive and time consuming to operate. Thermal annealing does not require melting of the top surface. However, it requires longer exposure to temperatures below the melting point, which may cause undesired diffusion of particles and changes of the crystalline structure.

Gas-phase chemical dry-cleaning processes have been used for years to clean semiconductor surfaces. Among the various chemical dry-cleaning processes, the supercritical fluid cleaning process offers many advantages.

At temperatures above 31° C. and pressure of 1072 psi, the liquid and gaseous phases of $CO_2$ combine to form supercritical $CO_2$ (SCCO2). Supercritical fluid possesses liquid-like solution and gas-like diffusion properties. SCCO2 has low viscosity and low dielectric constant. The low viscosity of SCCO2 enables rapid penetration into crevices, pores, trenches and vias with complete removal of both organic and inorganic contaminants. Organic contaminants that can be removed with SCCO2 include oils, grease, organic films, photoresist, plasticizers, monomers, lubricants, adhesives, fluorinated oils and surfactants. Inorganic contaminants that can be removed with SCCO2 include metals, metal complexing agents, inorganic particulates. Contaminants solvate within the SCCO2 and are evacuated into a low pressure chamber, where they become insoluble and are precipitated from the liquid $CO_2$. The supercritical fluid technology cleaning tool SCF-CT apparatus has a small footprint of about 75 square feet and sells for about $500K to $1M. Conventional water clean benches cost over $2M. The process of cleaning semiconductor surfaces using SCCO2 is described in a technical paper entitled "Precision Cleaning of Semiconductor Surfaces Using Carbon Dioxide Based Fluids" by J. B. Rubin, L. D. Sivils, and A. A. Busnaina published in Proceedings SEMI-CON WEST 99, Symposium On Contamination Free Manufacturing for Semiconductor Processing, San Francisco, Calif. Jul. 12–14, 1999, the entire content of which is expressly incorporate herein by reference.

While cleaning of semiconductor surfaces with SCCO2 has proven to be effective for removing particles, improved cleaning results are required before this process can become commercially successful. In particular, an intelligent cleaning system that incorporates defect diagnostics, optimal cleaning based on SCF-CT unique parameters, and defect eradication is desirable.

SUMMARY OF THE INVENTION

In general, in one aspect, the invention features a semiconductor wafer processing apparatus including equipment for identifying and characterizing surface defects on each wafer at at least one processing station and for creating a record of the surface defect data for each wafer and equipment for performing supercritical fluid cleaning of the wafers. The equipment for supercritical cleaning is adapted to receive the surface defect data from the created record and apply a supercritical fluid cleaning recipe based on the surface defect data. The apparatus further includes equipment for transferring a plurality of semiconductor wafers among a plurality of processing stations under computer control and equipment for transferring of cleaned wafers to an output station.

Implementations of this aspect of the invention may include one or more of the following features. The surface defect identification and characterization data may include position coordinates, type, density and size of surface defects on each wafer. The equipment for identifying and characterizing surface defects on each wafer may be an advanced patterned wafer inspection system with an automatic defect classification program. The advanced patterned wafer inspection system with an automatic defect classification program may be a COMPASS™ system with On-The-Fly Automatic Defect Classification (OTF™-ADC). The supercritical fluid cleaning recipe may be a generic recipe. The generic recipe may includes placing the wafers in a pressure chamber, introducing a gas that undergoes a supercritical transition into the pressure chamber, setting temperature and pressure condition in the pressure chamber to produce a supercritical fluid on the surface of the wafers and exposing the wafers for a predetermined time to the supercritical fluid. The supercritical fluid may be carbon dioxide and the temperature and pressure condition may range from 20 to 70° C. and 1050 to 10000 psi, respectively. The supercritical fluid may also be carbon monoxide, argon, nitrogen, helium, xenon, nitrous oxide, ethane, and propane. The supercritical fluid cleaning recipe may be a defect specific recipe. The defect specific recipe may include placing the wafers in a pressure chamber, introducing a gas that undergoes a supercritical transition into the pressure chamber, setting temperature and pressure condition in the pressure chamber to produce a supercritical fluid on the surface of the wafers, introducing a defect specific co-solvent into the pressure chamber creating a mixture of supercritical fluid with the defect specific co-solvent, and exposing the wafers for a predetermined time to the mixture. The defect specific co-solvent may be methanol, isopropyl alcohol and other related alcohols, butylene carbonate, propylene carbonate and related carbonates, ethylene glycol and related glycols, ozone, hydrogen fluoride and related fluorides, ammonium hydroxide and related hydroxides, citric acid and related acids and mixtures thereof. The volume ratio of the defect specific co-solvent to the supercritical fluid may be within the range of 0.001 to 15 percent.

The semiconductor processing apparatus of this aspect of the invention may further include equipment for identifying and locating specific stubborn defects with respect to their position coordinates and for updating the data records for any surface cleaned wafer. The equipment for locating specific stubborn defects may be a scanning electron microscope, an optical microscope, or an atomic force microscope. The apparatus of this aspect of the invention may further include equipment for performing an elemental chemical analysis of the specific stubborn defects. The equipment for performing a chemical analysis may be a mass spectrometer, a secondary ion mass spectrometer, a Raman spectrometer, an optical spectrometer, or an Auger spectrometer. The apparatus of this aspect of the invention may further include a database storing supercritical fluid cleaning recipe data. The supercritical fluid cleaning recipe data may include generic and defect specific recipes.

In general, in another aspect, the invention features a semiconductor wafer processing apparatus including equipment for identifying and characterizing surface defects on each wafer at at least one processing station and for creating a record of the surface defect data for each wafer at the processing station. The apparatus further includes equipment for performing supercritical fluid cleaning of the wafers. The equipment for supercritical fluid cleaning is adapted to receive the surface defect data from the record and apply a supercritical fluid cleaning recipe based on the surface defect data. The apparatus may further include equipment for identifying and locating specific stubborn defects with respect to their position coordinates and for updating the surface defect data records for any surface cleaned wafers and equipment for performing an elemental chemical analysis of the specific stubborn defects and for updating the surface defect data records for any surface cleaned wafers. The apparatus may further include equipment for performing a defect specific supercritical cleaning of the wafers to eradicate the specific stubborn defects. The equipment for defect specific supercritical cleaning is adapted to receive the updated surface defect data from the record and apply a defect specific supercritical fluid cleaning recipe. The apparatus further includes equipment for transferring a plurality of semiconductor wafers among a plurality of processing stations under computer control and equipment for transferring of cleaned wafers to an output station.

In general, in another aspect, the invention features a semiconductor wafer processing apparatus including a database storing supercritical fluid cleaning recipe data for at least one processing station, and equipment for performing supercritical fluid cleaning of the wafers at the at least one processing station. The equipment for supercritical cleaning is adapted to receive supercritical fluid cleaning recipe data from the database. The apparatus further includes equipment for transferring a plurality of semiconductor wafers among a plurality of processing stations under computer control and equipment for transferring of cleaned wafers to an output station.

In general, in another aspect, the invention features a method for semiconductor wafer processing including identifying and characterizing surface defects on each wafer at at least one processing station and creating a record of the surface defect data for each wafer at the at least one processing station. Next the surface defect data and the wafers are transferred to a supercritical fluid cleaning apparatus. Next a supercritical fluid cleaning of the wafers takes place. The supercritical fluid cleaning apparatus is adapted to apply a supercritical fluid cleaning recipe based on the surface defect data. The method further includes transferring a plurality of semiconductor wafers among a plurality of processing stations under computer control in a predetermined sequence starting at an input station and ending at an output station and finally transferring of the cleaned wafers to an output station.

In general, in another aspect, the invention features a semiconductor wafer processing method including first identifying and characterizing surface defects on each wafer at at least one processing station and creating a record of the surface defect data for each wafer at the at least one processing station. Next the surface defect data and the wafers are transferred to a supercritical fluid cleaning apparatus where a supercritical fluid cleaning of the wafers takes place. The supercritical fluid cleaning apparatus is adapted to apply a supercritical fluid cleaning recipe based on the surface defect data. Next specific stubborn defects are identified and located with respect to their position coordinates and the surface defect data records for any surface cleaned wafers are updated. Next an elemental chemical analysis of the specific stubborn defects takes place and the surface defect data records for any surface cleaned wafers are updated. The updated surface defect data are transferred to the supercritical fluid cleaning apparatus where a defect specific supercritical cleaning of the wafers is performed to eradicate the specific stubborn defects. The supercritical fluid cleaning apparatus is adapted to apply a defect specific supercritical fluid cleaning recipe based on the updated surface defect data. The method further includes transferring a plurality of semiconductor wafers among a plurality of processing stations under computer control in a predetermined sequence starting at an input station and ending at an output station and finally transferring of the cleaned wafers to an output station.

In general, in yet another aspect, the invention features a semiconductor wafer processing method including storing supercritical fluid cleaning recipe data for at least one processing station in a database. The supercritical fluid cleaning recipe data are transferred from the database to a supercritical fluid cleaning apparatus. The wafers are also transferred to the supercritical fluid cleaning apparatus where a supercritical fluid cleaning of the wafers takes place. The supercritical fluid cleaning apparatus is adapted to apply the supercritical fluid cleaning recipe. The method further includes transferring a plurality of semiconductor wafers among a plurality of processing stations under computer control in a predetermined sequence starting at an input station and ending at an output station and finally transferring of the cleaned wafers to an output station.

Among the advantages of this invention may be one or more of the following. The yield enhancement system (YES) of this invention enables the production of wafers with defect levels of 0.01 defects/cm$^2$ or less. This low defect level translates in significant IC test yield increases. Many semiconductor cleaning applications can be handled by the SCF-CT. The YES system has a significantly smaller footprint and costs less than the traditional wet-chemical process stations. The YES system of this invention is compatible with the small device dimensions and test yield requirements necessary to advance the IC fabrication process in the future. At defect densities of 0.12 defects/cm$^2$ and lower water based wafer cleaning becomes ineffective. The YES system of this invention is a technology enabler for achieving defect densities of 0.03 defects/cm$^2$ and lower. Furthermore, the YES system of this invention produces an economic benefit of the order of several billion dollars in wafer production of 1000 wafer starts per day over the period of one year. Referring to Table 1, the YES system of this invention can produce a SOC wafer with 52 potential dies, a defect level of 0.01 defects/cm$^2$ and a corresponding yield of 64%. The 64% test yield of the 52 die-SOC translates into 33 good dies. Assuming a price of $1000.00 per die and a daily production of 1000 good wafers this translates to $33 million dollars per day or $10 billion dollars per year in good SOC dies. Similarly, for the same SOC wafer with 52 dies at a defect level of 0.04 defects/cm$^2$ and a corresponding yield of 12% we get $2 billion per year of good dies. Therefore, the YES system of this invention enables us to capture a revenue potential of $8 billion per year on SOC wafer production.

The details of one or more embodiments of the invention are set forth in the accompanying drawings and description below. Other features, objects and advantages of the invention will be apparent from the following description of the preferred embodiments, the drawings and from the claims.

BRIEF DESCRIPTION OF THE DRAWINGS

Referring to the figures, wherein like numerals represent like parts throughout the several views.

DETAILED DESCRIPTION OF THE INVENTION

Figure 1:
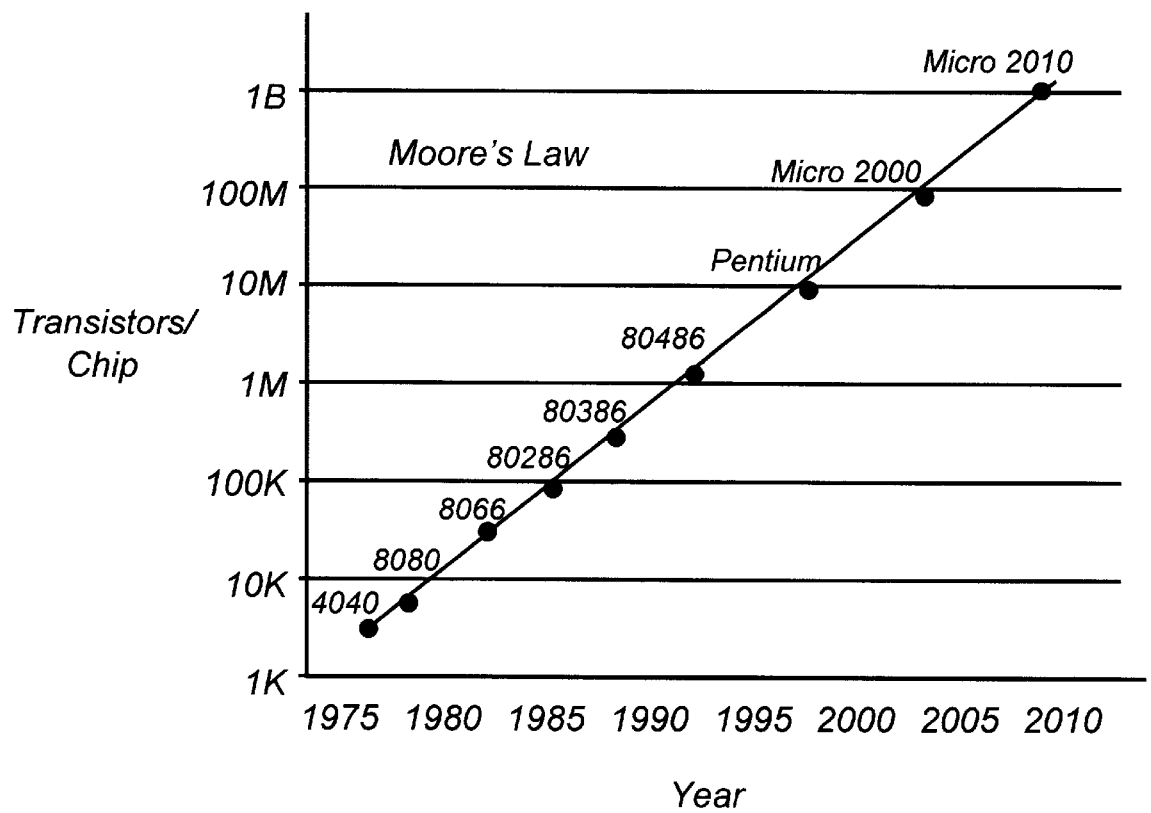
FIG. 1 is a logarithmic plot of the Number of Transistors per Chip versus the year, known as Moore's Law.
Figure 2:
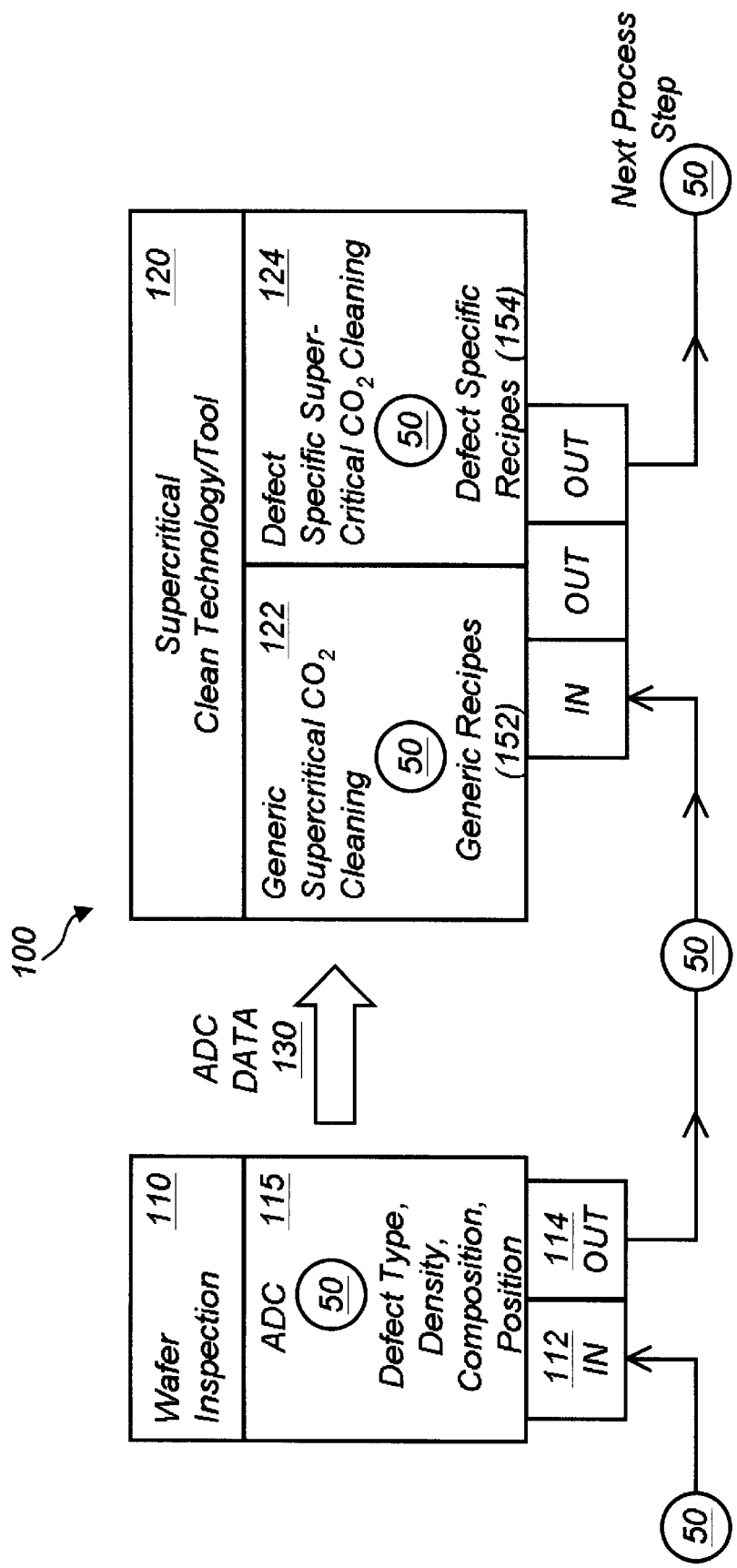
FIG. 2 is a diagrammatic view of a Rapid Yield Enhancement System (RYES) for semiconductor processing.

Referring to FIG. 2, a Rapid Yield Enhancement System (RYES) 100 for semiconductor wafer processing includes a wafer inspection system 110 that performs defect detection and characterization system, and a supercritical fluid technology cleaning tool (SCFT-CT) 120. Wafer 50 enters into the wafer inspection system 110 through the IN port 112. The wafer inspection system 110 scans the wafer surface and detects the type, density, size, and position of surface defects. An automatic defect classification program 115 (ADC) groups the defect data in different categories, ADC Data 130. The ADC Data 130 comprising the defect type, density, size, and position data are then transferred to the supercritical fluid technology tool 120. After the inspection wafer 50 exits the inspection system 110 via OUT port 114 and enters the SCFT-CT 120. The SCF-CT 120 applies first a series of generic 152 for general supercritical fluid cleaning to wafer 50. The general supercritical fluid cleaning 122 is followed by defect specific supercritical cleaning 124 utilizing defect-specific recipes 154. Both the generic 152 and specific recipes 154 are chosen based on the information of the ADC defect data 130 provided by the defect characterization system 110. The RYES 100 is used for on-line electrical test yield improvement of semiconductor wafer manufacturing.

One example of an on-line wafer inspection system 110 for defect detection and characterization is the COMPASS™ Advanced Patterned Wafer Inspection System for Process Monitoring, manufactured by Applied Materials, 350 Bowers Avenue, Santa Clara, Calif. COMPASS™ is an advanced patterned wafer inspection system designed for process monitoring down to the 100 nanometers design rule and below. The COMPASS™ system has the capability of On-The-Fly (OTF™) defect grouping that separates all the detected defects to coarse bins for tighter excursion control and review optimization (data reduction). Furthermore, the COMPASS™ system has high throughput of up to 60 wafers per hour (WPH) and On-The-Fly Automatic Defect Classification (OTF™-ADC). The OTF™-ADC enables efficient process monitoring by providing (a) statistically significant classified defect pareto in real time; (b) real-time data reduction for efficient sampling; (c) smart identification of defects through ADC and comparisons with a set of defect standards (type, topology, chemical composition, e.g. fingerprints).

Figure 3:
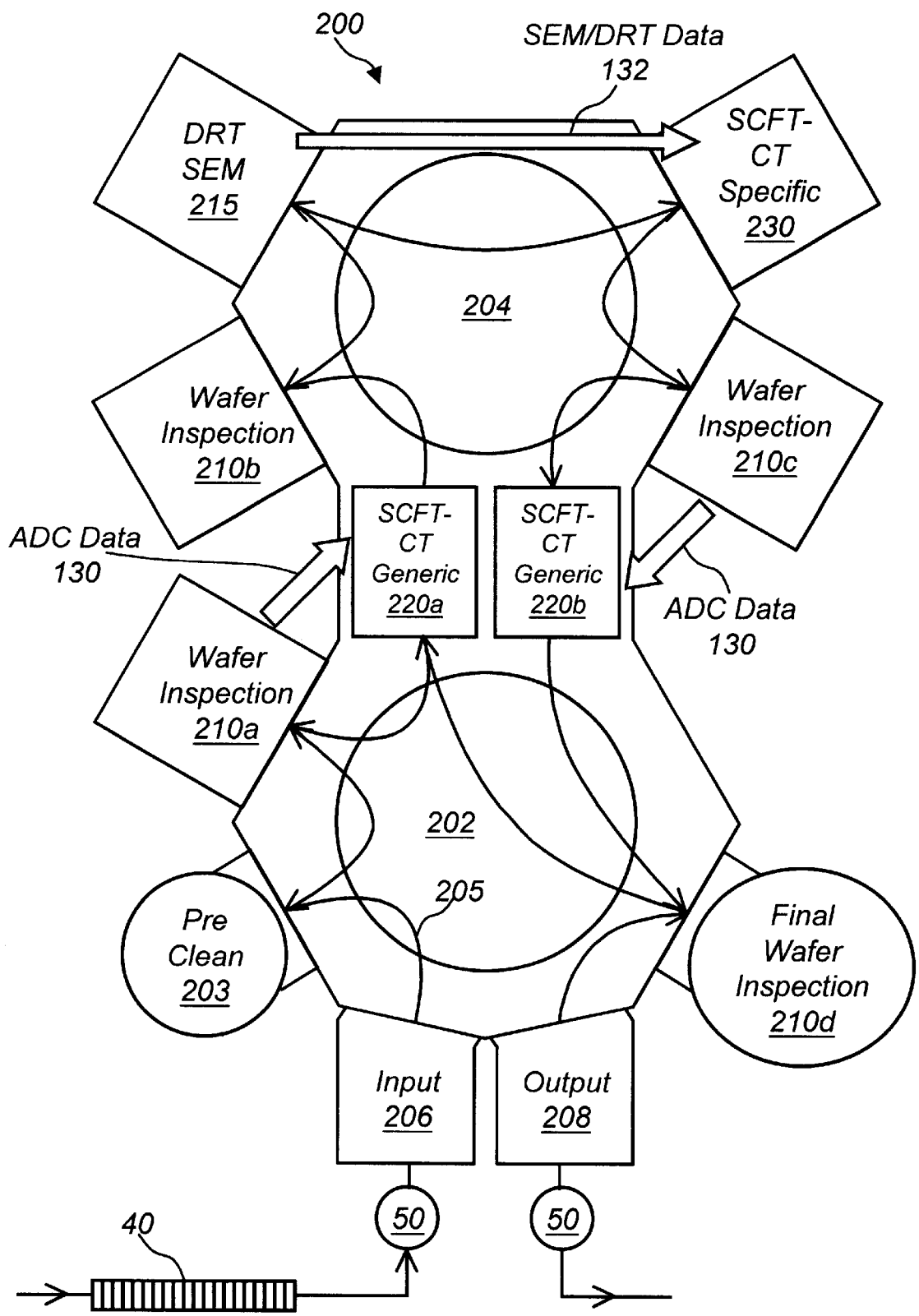
FIG. 3 is a diagrammatic view of an Analytic Yield Enhancement Apparatus (AYES) for semiconductor processing.

In the embodiment of FIG. 3 an apparatus for an Analytical Yield Enhancement System (AYES) 200 includes general SCFT-CT 220a, 220b and defect-specific SCFT-CT 230, Wafer Inspection Stations, 210a, 210b, 210c, 210d, Scanning Electron Microscope with a Defect Review Tool (SEM-DRT) 215, computer controlled cluster tooling 202, 204 for wafer handling and input and output ports 206, 208, respectively. Curved arrows 205 show schematically the movement of wafers from station to station. The SEM-DRT is coupled with automatic defect classification (ADC) software. The AYES 200 is used for laboratory off-line electrical test yield improvement of semiconductor wafer processing.

In one example, general SCF-CT 220 and defect-specific SCF-CT 230 are apparatuses manufactured by GT Equipment Technologies Inc./Supercritical Fluids, Nashua, N.H.; wafer inspection stations 210a–210d are apparatuses manufactured by KLA, 160 San Roblas, San Jose, Calif.; Scanning Electron Microscope-Defect Review Tool (SEM-DRT) 215 is an apparatus manufactured by KLA/Amray, 160 Middlesex Turnpike, Bedford, Mass.; computer software programs 115 that perform automatic defect classification (ADC) are commercially available by Applied Materials, 350 Bowers Avenue, Santa Clara, Calif.; computer controlled cluster tooling for wafer handling purposes including the input and output ports are apparatuses manufactured by Applied Materials, 350 Bowers Avenue, Santa Clara, Calif. Most of the stations in FIGS. 3 and 6 operate with gas atmospheres such as clean air. Furthermore, some of the stations (e.g., wafer pre-clean station and SEM-DRT) require vacuum for their operation, and therefore require conventional airlock interfaces.

Figure 4:
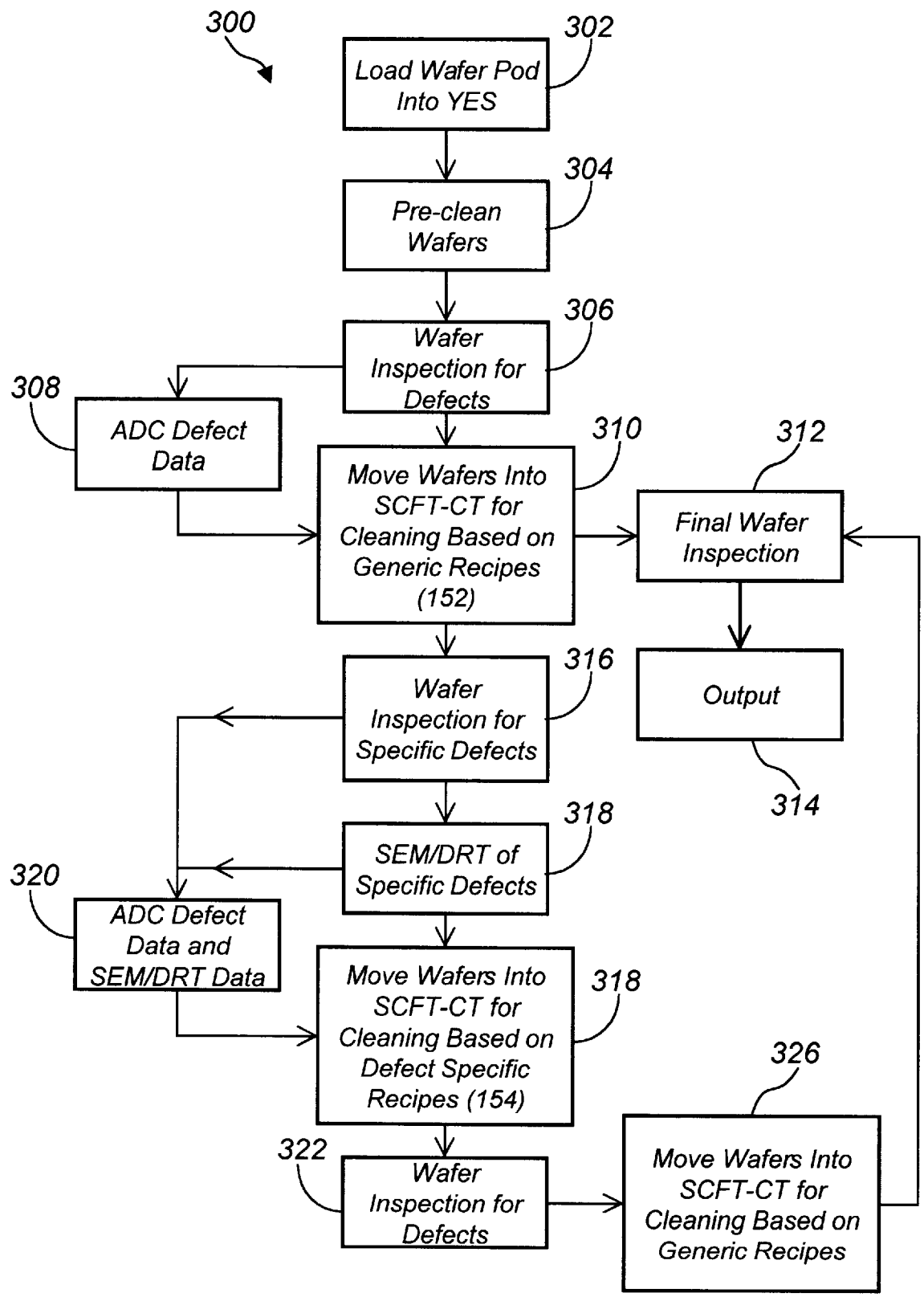
FIG. 4 is a flow diagram of a yield enhancement method for semiconductor processing.

Referring to FIGS. 4 and 3, the following steps are performed during a Yield Enhancement process 300. Wafers 50 coming to the AYES apparatus 200 in a pod of wafers 40 (shown in FIG. 3) are loaded at input port 206 (302). Optionally, wafers 50 are processed one by one at a pre-clean station 203 (304). Pre-cleaning is used for removing a sacrificial film, e.g., colloidal film or photoresist. Wafers 50 are moved to a wafer inspection station 210a. Wafers 50 are scanned for defects and the x-y positional coordinates of the defects are determined (306). The defect data from station 210a are grouped by an ADC program and the ADC data 130 are transferred to SCFT-CT 220a (308). Wafers 50 are transferred to SCFT-CT station 220a and a general supercritical fluid cleaning takes place utilizing generic recipes (310). Wafers 50 now are subject to optionally being directed to Final wafer inspection station 210d (312) and output station 208 ("clean wafers") (314); or Wafer inspection station 210b ("partially clean" wafers) (316).

After wafer inspection station 210b, wafers 50 are routed to scanning electron microscope (SEM) and Defect Review Tool (DRT) Station 215 (318). The wafers 50 are imaged with the high resolution SEM and the chemical composition of the defects is determined with the DRT. This stage is used to detect and characterize extremely "stubborn defects". The SEM and DRT data 132 are transferred to the SCFT-CT 230 (320). Wafers 50 are then routed to the SCFT-CT 230 (322) where defect specific recipes for supercritical cleaning of the "stubborn defects" are applied (322). The wafers 50 are then inspected again at station 210c (324) and the ADC data 130 are transferred to SCFT-CT 220b. The wafers 50 are then directed to SCFT-CT 220b for another general supercritical fluid cleaning (326). The wafers 50 then go through a final wafer inspection station 210d (312) and outputted at output station 208 (314).

In one example, a generic supercritical fluid cleaning recipe for a post chemical mechanical polishing (CMP) process step includes placing the wafers in a pressure chamber. The pressure chamber is then sealed and pressurized with the carbon dioxide. As the pressure inside the pressure chamber builds up, the carbon dioxide becomes liquid and reaches supercritical pressure and temperature. Typical conditions for reaching the supercritical phase range from 20 to 70° C. and 1050 to 10000 psi. In addition to chamber pressure and temperature, other process variables of the supercritical fluid cleaning recipe include wafer temperature, soak time, pulsing, i.e., rate of depressurization, flow rate, flow pattern, flow nozzle design, and ratio of liquid to supercritical carbon dioxide mixture. Other gases that may be used for supercritical fluid cleaning include among others argon, nitrogen, nitrous oxide, ethane, and propane.

For defect specific supercritical fluid cleaning a small amount of a specific co-solvent is introduced into the SCCO2 stream. Typical co-solvents that can be added in the SCCO2 stream include methanol, isopropyl alcohol and other related alcohols, butylene carbonate, propylene carbonate and related carbonates, ethylene glycol and related glycols, ozone, hydrogen fluoride and related fluorides, ammonium hydroxide and related hydroxides, citric acid and related acids and mixtures thereof. The amount of the added chemicals range between 0.001 to 15% of volume. In addition to chemistry and the above mentioned parameters, other process variables of the defect specific supercritical fluid cleaning recipe include the concentration of co-solvent and its flow rate. In one example, 3.7 volume percent of butylene carbonate is introduced with a spray nozzle into the SCCO2 stream at a temperature of 85° C., pressure of 2900 psi, and flow rate of 1 liter/minute to remove a fluorinated residue.

Generic and defect specific supercritical cleaning recipes are described in U.S. Pat. Nos. 6,277,753, 5,868,862, and 6,203,406, incorporated herein by reference.

Figure 5:
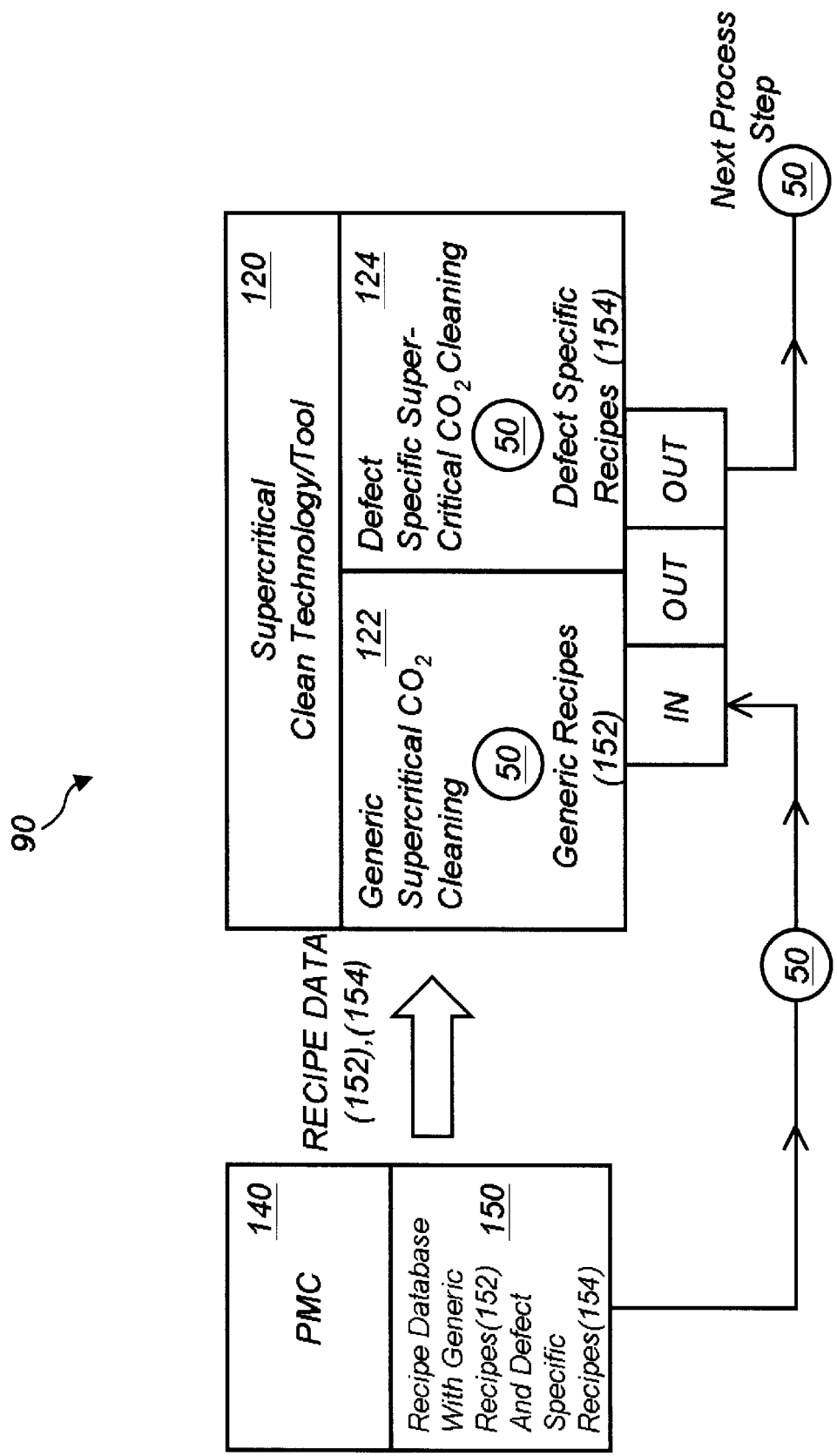
FIG. 5 is a diagrammatic view of an Archival Yield Enhancement System (ARYES) for semiconductor processing.

Referring to FIG. 5 another embodiment of the test yield enhancement system, Archival Yield Enhancement System (ARYES) 90 for semiconductor wafer processing includes a recipe database 150 and a supercritical fluid technology cleaning tool (SCFT-CT) 120. Database 150 contains data for generic recipe supercritical fluid cleaning 152 and defect specific recipe supercritical fluid cleaning 154 for each process step of the IC fabrication. Both the generic 152 and defect specific cleaning recipes 154 are based on historical statistical defect data for semiconductor wafer cleaning. After a specific process step, e.g. contact formation, wafer 50 enters the SCF-CT 120 cleaning tool. Recipe data for both generic area 152 and specific defect 154 cleaning appropriate for surface cleaning after the specific process step of the contact formation are transferred to the SCF-CT tool processor. A general supercritical fluid cleaning followed by a specific defect cleaning is applied to wafer 50. The SCF-CT for generic and defect specific supercritical fluid cleaning may be two separate pieces of equipment or the same piece of equipment equipped with a special configuration to accommodate defect specific cleaning.

Figure 6:
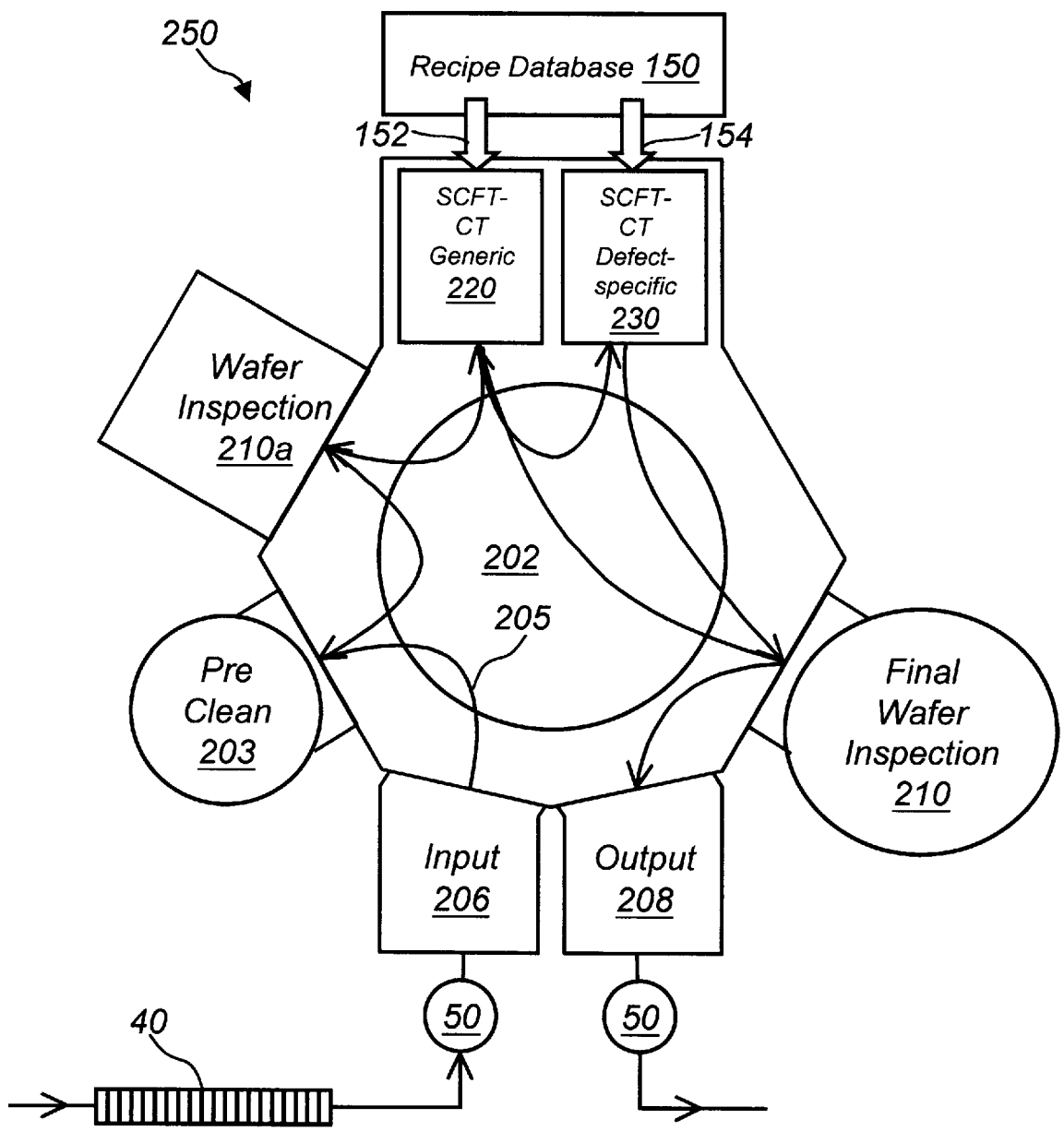
FIG. 6 is a diagrammatic view of another embodiment of a yield enhancement apparatus for semiconductor processing.

Referring to FIG. 6 an apparatus 250 according to the above mentioned embodiment of the ARYES system includes generic SCFT-CT 220, defect-specific SCFT-CT 230, a pre-clean chamber 203, a wafer inspection station 210, computer controlled cluster tooling 202 for wafer handling, input and output ports 206, 208, respectively, process module controller 140, and recipe database 150. Curved arrows 205 show schematically the movement of wafers from station to station. Process module controller (PMC) 140 creates process recipes and stores them in database 150. The PMC 140 can create unlimited number of process recipes, with unlimited number of process steps based on input data from statistical process control software.

Figure 7:
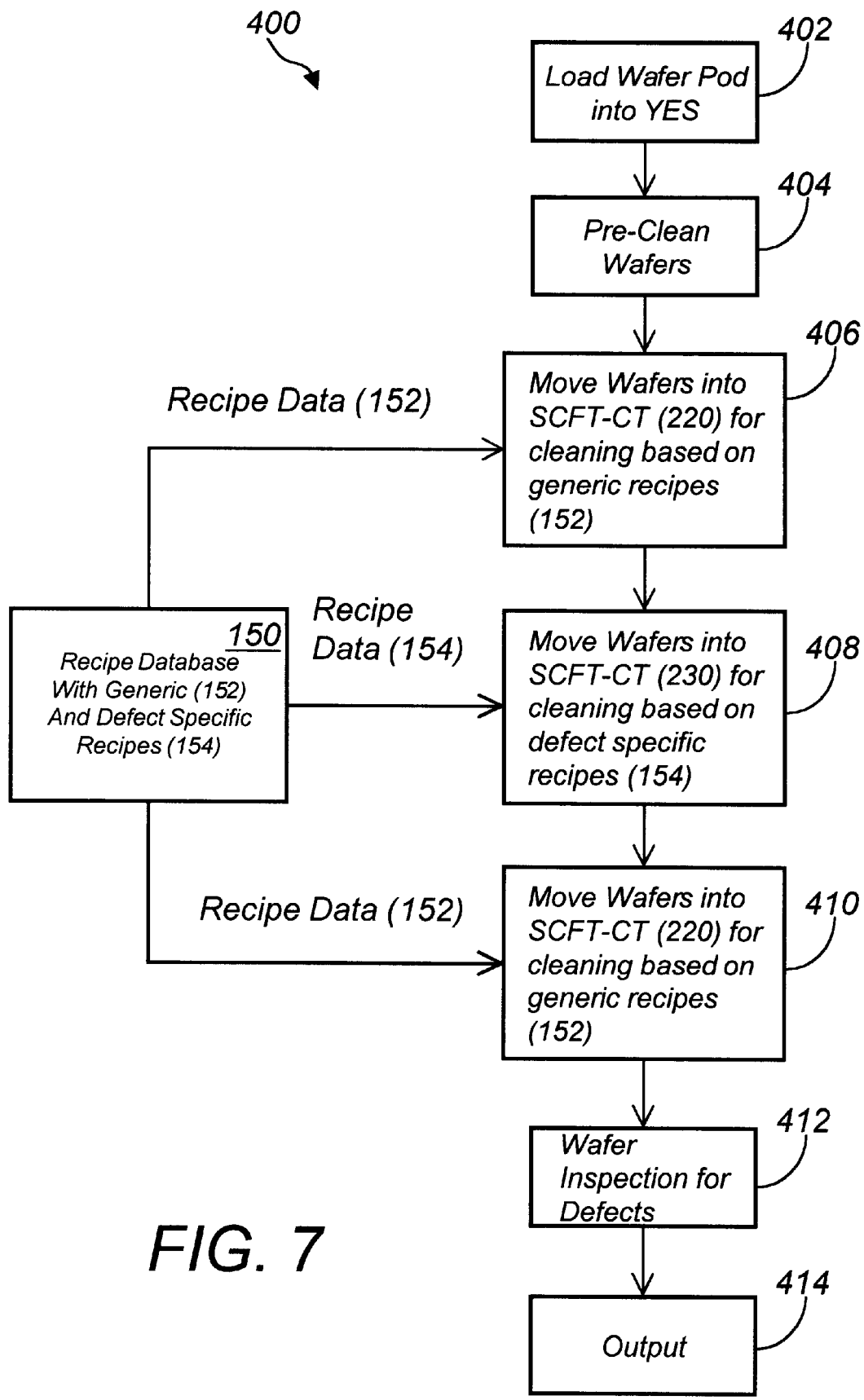
FIG. 7 is a flow diagram of another embodiment of a yield enhancement method for semiconductor processing.

Referring to FIGS. 6 and 7, the following steps are performed during this embodiment of a Yield Enhancement process 400. Wafers 50 coming to the ARYES system 250 in a pod of wafers 40 are loaded at input port 206 (402). Optionally, wafers 50 are processed one by one at a pre-clean station 203 (404). Wafers 50 are then transferred to SCFT-CT station 220 and a general supercritical fluid cleaning takes place utilizing generic recipes 152 (406). Recipe database 150 stores and provides the generic recipe data 152 to the SCFT-CT processor. Wafers 50 are then routed to defect specific SCFT-CT 230 (408) where defect specific cleaning takes place utilizing defect specific recipes 154. Recipe database 150 also stores and provides the specific defect recipe data 154 to the SCFT-CT processor. The wafers 50 are then optionally directed through another area cleaning process (410). Finally wafers 50 pass through an inspection station (412) and outputted at output station 208 (414).

Figure 8:
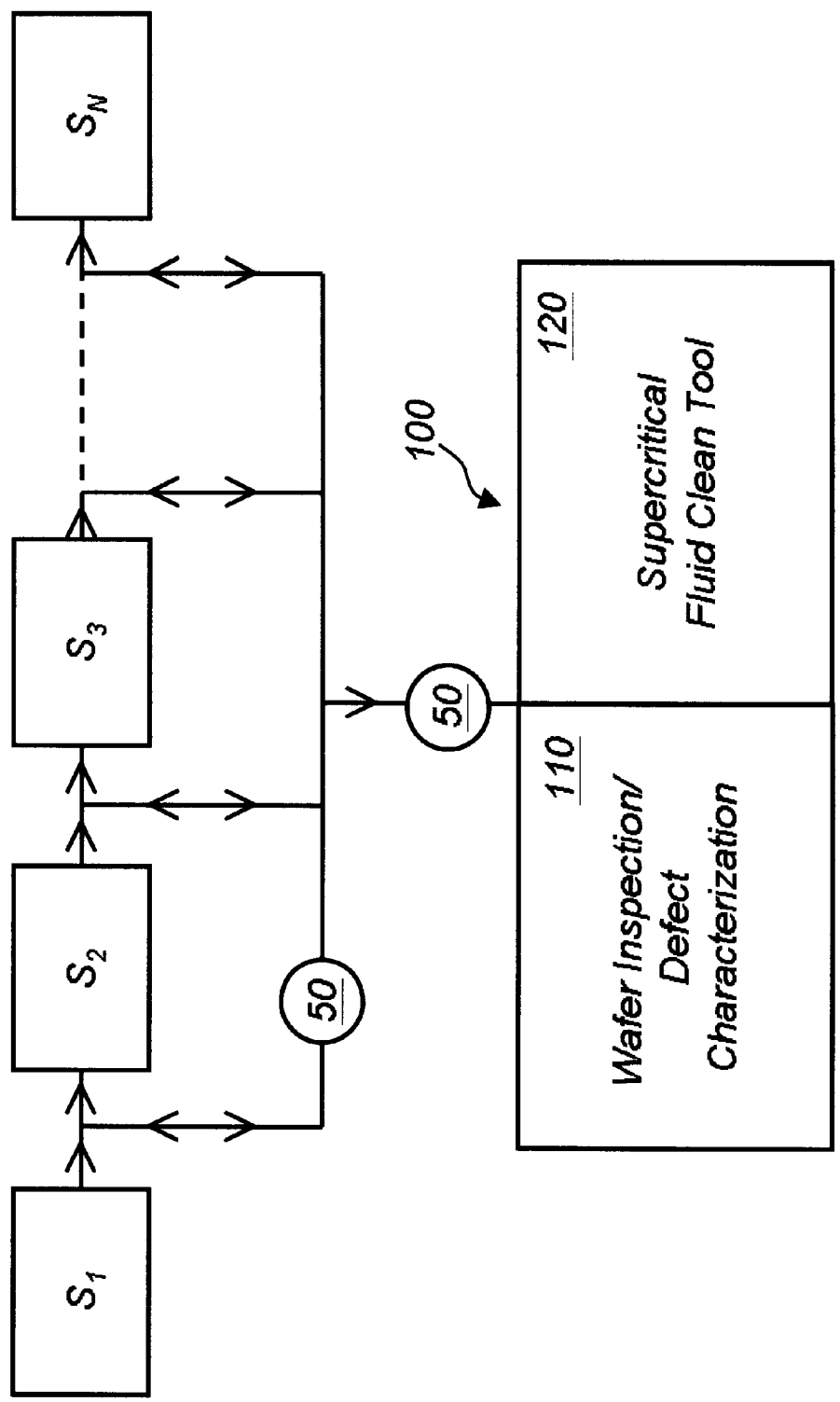
FIG. 8 is a diagrammatic view of a yield enhancement system integrated in a multi-step semiconductor processing system.

Referring to FIG. 8, a typical semiconductor process for IC fabrication contains over 150 individual steps S1, S2, S3 . . . SN and requires many weeks to complete. Each one of these steps can generate particulates, film deposits, dust and other contaminants which can result in producing "killer" defects that can impact the IC electrical test yield. Several of the more susceptible process steps include among others, multiple resist strips, multiple chemical mechanical polishing (CMP) steps, multiple interlevel dielectric etching steps, formation of vias and or trenches via etching, N-well implantation and P-well implantation. Furthermore the back end of the line processes produce the majority of the wafer process defects. Back end line processes include deposition of metals, insulators, formation of vias, and CMP of these structures. These defects originate primarily from process tooling and chemicals. After each step S1, S2 . . . SN, wafers 50 are placed in the YES system 100 for defect characterization 110 and surface cleaning via the SCF-CT 120. The use of SCCO2 cleaning technology adapted to specific cleaning recipes removes these different type of defects and substantially increases the IC test yields.

In one example, in a 430 $mm^2$ chip we observed a decrease in defect density from 1.0 defect/$cm^2$ to 0.1 defects/$cm^2$ with the RYES 100 system of this invention. The corresponding test yield increased from 5% for the 1.0 defect/$cm^2$ defect level to 68% for the 0.1 defects/$cm^2$ defect level. Similarly for a 520 $mm^2$ chip we observed a decrease in defect density from 1.0 defects/$cm^2$ to 0.1 defects/$cm^2$ and a corresponding test yield increase from 0% to 63%, respectively.

Other embodiments are within the scope of the following claims. For example, the defect detection and characterization system for "stubborn defects" 215 may include an optical microscope, a transmission electron microscope, or an atomic force microscope for defect detection. For performing chemical analysis of the "stubborn defects" system 215 may also include a mass spectrometer, a secondary ion mass spectrometer (SIMS), an optical spectrometer, a Raman spectrometer, an atomic absorption spectrometer (AAS), an Auger spectrometer, or an Extended X-Ray Absorption Fine Structure (EXAFS) spectrometer.

Several embodiments of the present invention have been described. Nevertheless, it will be understood that various modifications may be made without departing from the spirit and scope of the invention. Accordingly, other embodiments are within the scope of the following claims.

What is claimed is:

1. A semiconductor wafer processing apparatus comprising:

equipment for transferring a plurality of semiconductor wafers among a plurality of processing stations under computer control;

equipment for identifying and characterizing surface defects on each wafer at at least one of said processing stations and for creating a record of said surface defect data for each wafer at said at least one processing station;

equipment for performing supercritical fluid cleaning of said wafers, wherein said equipment for supercritical cleaning is adapted to receive said surface defect data from said record and apply a supercritical fluid cleaning recipe based on said surface defect data; and equipment for transferring of cleaned wafers to an output station.

2. The apparatus of claim 1 wherein said record of said surface defect data comprises position coordinates, type, density and size of surface defects on each wafer.

3. The apparatus of claim 1 wherein said equipment for identifying and characterizing surface defects on each wafer is an advanced patterned wafer inspection system with an automatic defect classification program.

4. The apparatus of claim 3 wherein said advanced patterned wafer inspection system with an automatic defect classification program is a COMPASS™ system with On-The-Fly Automatic Defect Classification (OTF™-ADC).

5. The apparatus of claim 1 wherein said supercritical fluid cleaning recipe is a generic recipe comprising:

placing said wafers in a pressure chamber;

introducing a gas that undergoes a supercritical transition into said pressure chamber;

setting temperature and pressure in said pressure chamber to produce a supercritical fluid on the surface of said wafer; and exposing said wafers for a predetermined time to said supercritical fluid.

6. The apparatus of claim 5 wherein said supercritical fluid is carbon dioxide and said temperature and pressure range from 20 to 70° C. and 1050 to 10000 psi, respectively.

7. The apparatus of claim 5 wherein said supercritical fluid is selected from a group consisting of carbon dioxide, carbon monoxide, argon, nitrogen, helium, xenon, nitrous oxide, ethane, and propane.

8. The apparatus of claim 1 wherein said supercritical fluid cleaning recipe is a defect specific recipe comprising:
placing said wafers in a pressure chamber;
introducing a gas that undergoes a supercritical transition into said pressure chamber;
setting temperature and pressure in said pressure chamber to produce a supercritical fluid on the surface of said wafers;
introducing a defect specific co-solvent into said pressure chamber creating a mixture of supercritical fluid with said defect specific co-solvent; and
exposing said wafers for a predetermined time to said mixture.

9. The apparatus of claim 8 wherein said defect specific co-solvent is selected from the group consisting of methanol, isopropyl alcohol and other related alcohols, butylene carbonate, propylene carbonate and related carbonates, ethylene glycol and related glycols, ozone, hydrogen fluoride and related fluorides, ammonium hydroxide and related hydroxides, citric acid and related acids and mixtures thereof.

10. The apparatus of claim 8 wherein a volume ratio of said defect specific co-solvent to the supercritical fluid is within the range of 0.001 to 15 percent.

11. The apparatus of claim 1 further comprising:
equipment for identifying and locating specific stubborn defects with respect to their position coordinates and for updating said data records for any surface cleaned wafer.

12. The apparatus of claim 11 wherein said equipment for locating specific stubborn defects is selected from a group consisting of a scanning electron microscope, an optical microscope, and an atomic force microscope.

13. The apparatus of claim 11 further comprising:
equipment for performing an elemental chemical analysis of said specific stubborn defects.

14. The apparatus of claim 13 wherein said equipment for performing a chemical analysis is selected from a group consisting of a mass spectrometer, a secondary ion mass spectrometer, a Raman spectrometer, an optical spectrometer, and an Auger spectrometer.

15. The apparatus of claim 1 further comprising:
a database storing supercritical fluid cleaning recipe data.

16. The apparatus of claim 15 wherein said supercritical fluid cleaning recipe data comprise generic and defect specific recipes.

17. A semiconductor wafer processing apparatus comprising:
equipment for transferring a plurality of semiconductor wafers among a plurality of processing stations under computer control;
equipment for identifying and characterizing surface defects on each wafer at at least one of said processing stations and for creating a record of said surface defect data for each wafer at said at least one processing station;
equipment for performing supercritical fluid cleaning of said wafers, wherein said equipment for performing supercritical fluid cleaning is adapted to receive said surface defect data from said record and apply a supercritical fluid cleaning recipe based on said surface defect data;
equipment for identifying and locating specific stubborn defects with respect to their position coordinates and for updating said surface defect data records for any surface cleaned wafers;
equipment for performing an elemental chemical analysis of said specific stubborn defects and for updating said surface defect data records for any surface cleaned wafers;
equipment for performing a defect specific supercritical cleaning of said wafers to eradicate said specific stubborn defects wherein said equipment for defect specific supercritical cleaning is adapted to receive said updated surface defect data from said record and apply a defect specific supercritical fluid cleaning recipe; and
equipment for transferring of cleaned wafers to an output station.

18. A semiconductor wafer processing apparatus comprising:
equipment for transferring a plurality of semiconductor wafers among a plurality of processing stations under computer control;
a database storing supercritical fluid cleaning recipe data for at least one of said processing stations; and
equipment for performing supercritical fluid cleaning of said wafers at said at least one processing station, wherein said equipment for supercritical cleaning is adapted to receive supercritical fluid cleaning recipe data based on surface defect data for said at least one processing station from said database.

19. A method for semiconductor wafer processing comprising:
transferring a plurality of semiconductor wafers among a plurality of processing stations under computer control in a predetermined sequence starting at an input station and ending at an output station;
identifying and characterizing surface defects on each wafer at at least one of said processing stations and creating a record of said surface defect data for each wafer at said at least one processing station;
transferring said surface defect data to a supercritical fluid cleaning apparatus;
transferring said wafers to said supercritical fluid cleaning apparatus;
performing supercritical fluid cleaning of said wafers, wherein said supercritical fluid cleaning apparatus is adapted to apply a supercritical fluid cleaning recipe based on said surface defect data; and
transferring of cleaned wafers to an output station.

20. The method of claim 19 wherein said surface defect identification and characterization data comprise position coordinates, type, density and size of surface defects on each wafer.

21. The method of claim 19 wherein said identifying and characterizing of surface defects on each wafer is performed by an advanced patterned wafer inspection system with an automatic defect classification program.

22. The method of claim 21 wherein said advanced patterned wafer inspection system with an automatic defect classification program is a COMPASS™ system with On-The-Fly Automatic Defect Classification (OTF™-ADC).

23. The method of claim 19 wherein said supercritical fluid cleaning recipe is a generic recipe comprising:
placing said wafers in a pressure chamber;
introducing a gas that undergoes a supercritical transition into said pressure chamber;
setting temperature and pressure condition in said pressure chamber to produce a supercritical fluid on the surface of said wafer; and exposing said wafers for a predetermined time to said supercritical fluid.

24. The method of claim 23 wherein said supercritical fluid is carbon dioxide and said temperature and pressure range from 20 to 70° C. and 1050 to 10000 psi, respectively.

25. The method of claim 23 wherein said supercritical fluid is selected from a group consisting of carbon dioxide, carbon monoxide, argon, nitrogen, helium, xenon, nitrous oxide, ethane, and propane.

26. The method of claim 19 wherein said supercritical fluid cleaning recipe is a defect specific recipe comprising:

placing said wafers in a pressure chamber;

introducing a gas that undergoes a supercritical transition into said pressure chamber;

setting temperature and pressure in said pressure chamber to produce a supercritical fluid on the surface of said wafers;

introducing a defect specific co-solvent into said pressure chamber creating a mixture of supercritical fluid with said defect specific co-solvent; and exposing said wafers for a predetermined time to said mixture.

27. The method of claim 26 wherein said defect specific co-solvent is selected from the group consisting of methanol, isopropyl alcohol and other related alcohols, butylene carbonate, propylene carbonate and related carbonates, ethylene glycol and related glycols, ozone, hydrogen fluoride and related fluorides, ammonium hydroxide and related hydroxides, citric acid and related acids and mixtures thereof.

28. The method of claim 26 wherein a volume ratio of said defect specific co-solvent to the supercritical fluid is within the range of 0.001 to 15 percent.

29. The method of claim 19 further comprising:

identifying and locating specific stubborn defects on each wafer with respect to their position coordinates and updating said surface defect data record for any surface cleaned wafer.

30. The method of claim 29 wherein said identifying and locating of specific stubborn defects is performed by equipment selected from a group consisting of a scanning electron microscope, an optical microscope, and an atomic force microscope.

31. The method of claim 29 further comprising:

performing an elemental chemical analysis of said specific stubborn defects.

32. The method of claim 31 wherein said chemical analysis is performed by equipment selected from a group consisting of a mass spectrometer, a secondary ion mass spectrometer, a Raman spectrometer, an optical spectrometer, and an Auger spectrometer.

33. The method of claim 19 further comprising:

storing supercritical fluid cleaning recipe data in a database.

34. The method of claim 33 wherein said supercritical fluid cleaning recipe data comprise generic and defect specific supercritical cleaning recipes.

35. A semiconductor wafer processing method comprising:

transferring a plurality of semiconductor wafers among a plurality of processing stations under computer control in a predetermined sequence starting at an input station and ending at an output station;

identifying and characterizing surface defects on each wafer at at least one of said processing stations and creating a record of said surface defect data for each wafer at said at least one processing station;

transferring said surface defect data to a supercritical fluid cleaning apparatus;

transferring said wafers to said supercritical fluid cleaning apparatus;

performing supercritical fluid cleaning of said wafers, wherein said supercritical fluid cleaning apparatus is adapted to apply a supercritical fluid cleaning recipe based on said surface defect data;

identifying and locating specific stubborn defects with respect to their position coordinates and updating said surface defect data records for any surface cleaned wafers;

performing an elemental chemical analysis of said specific stubborn defects and updating said surface defect data records for any surface cleaned wafers;

transferring said updated surface defect data to said supercritical fluid cleaning apparatus;

performing a defect specific supercritical cleaning of said wafers to eradicate said specific stubborn defects wherein said supercritical fluid cleaning apparatus is adapted to apply a defect specific supercritical fluid cleaning recipe based on said updated surface defect data; and transferring of cleaned wafers to an output station.

36. A semiconductor wafer processing method comprising:

transferring a plurality of semiconductor wafers among a plurality of processing stations under computer control;

storing supercritical fluid cleaning recipe data for at least one of said processing stations in a database;

transferring a supercritical fluid cleaning recipe from said database to a supercritical fluid cleaning apparatus;

transferring said wafers to said supercritical fluid cleaning apparatus; and performing supercritical fluid cleaning of said wafers, wherein said supercritical fluid cleaning apparatus is adapted to apply said supercritical fluid cleaning recipe based on surface defect data.

* * * * *